(12) United States Patent
Lee (10) Patent No.: US 7,250,337 B2
(45) Date of Patent: Jul. 31, 2007

(54) METHOD FOR FABRICATING A NONVOLATILE SONOS MEMORY DEVICE

(75) Inventor: Sang Bum Lee, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/121,867

(22) Filed: May 3, 2005

(65) Prior Publication Data
US 2005/0247971 A1   Nov. 10, 2005

(30) Foreign Application Priority Data
May 6, 2004 (KR) ............... 10-2004-0031864

(51) Int. Cl.
*H01L 21/336* (2006.01)
(52) U.S. Cl. ............ 438/257; 438/261; 438/265; 438/267; 438/954
(58) Field of Classification Search ......... 438/257, 438/261, 265, 267, 954; 257/316
See application file for complete search history.

(56) References Cited

U.S. PATENT DOCUMENTS 5,716,862 A * 2/1998 Ahmad et al. ............ 438/303
7,009,244 B2 * 3/2006 Jenq et al. ............... 257/316
2003/0087493 A1 * 5/2003 Jenq et al. ............... 438/265
2005/0227446 A1 * 10/2005 Kao et al. ................ 438/305

FOREIGN PATENT DOCUMENTS

KR    10-0309815    9/2001

OTHER PUBLICATIONS

Sang Hwan Jang and Jae Hyeon Son; Split Gate Type Flash Eeprom Cell and Driving Method Thereof; Korean Patent Abstracts; Published Sep. 11, 2001; Korean Intellectual Property Office, Republic of Korea.

* cited by examiner

*Primary Examiner*—Zandra V. Smith
*Assistant Examiner*—Toniae M. Thomas
(74) *Attorney, Agent, or Firm*—Andrew D. Fortney

(57) ABSTRACT

A nonvolatile memory device and a method for fabricating the same is disclosed, to prevent a "smiling" phenomenon in an ONO layer, thereby improving the programming and erasing characteristics, reliability and yield. The device generally includes a semiconductor substrate; a gate insulating layer, a selection gate and a first insulating layer on the semiconductor substrate; an ONO layer formed on the semiconductor substrate including the selection gate; and a control gate formed on the ONO layer at least partially overlapping with the selection gate.

15 Claims, 10 Drawing Sheets

METHOD FOR FABRICATING A NONVOLATILE SONOS MEMORY DEVICE

CROSS-REFERENCE TO RELATED APPLICATIONS

This application claims the benefit of Korean Application No. P2004-31864, filed on May 6, 2004, which is hereby incorporated by reference as if fully set forth herein.

BACKGROUND OF THE INVENTION

1. Field of the Invention

The present invention relates to a nonvolatile memory device, and more particularly, to a nonvolatile memory device and a method for fabricating the same, configured to prevent a "smiling" phenomenon in an ONO (oxide-nitride-oxide) layer in a SONOS nonvolatile memory device.

2. Discussion of the Related Art

Generally, nonvolatile memory devices are advantageous in that data is not lost even when a power supply is stopped. In this respect, nonvolatile memory devices are widely used for data storage of a PC BIOS, a set-top box, a printer or a network server. Recently, nonvolatile memory devices are also used for a digital camera and a mobile phone.

Among nonvolatile memory devices, an EEPROM (Electrically Erasable Programmable Read-Only Memory) type nonvolatile memory device may completely erase data from memory cells, or may erase data from memory cells by each unit sector. In this EEPROM type nonvolatile memory device, in a programming mode, channel hot electrons are generated at the side of the drain and stored in a floating gate, whereby a threshold voltage of a cell transistor increases. In an erasing mode of the EEPROM type nonvolatile memory device, a relatively high voltage is generated between the floating gate and source/substrate, and the electrons stored in the floating gate are discharged, thereby lowering the threshold voltage of the cell transistor.

With rapid development of high-integration devices, the size of the floating gate type cell has generally decreased according to the related art. However, beyond a certain size, it is difficult to decrease the cell size further since the cell generally requires a relatively high voltage in the programming and erasing modes. Furthermore, it is difficult to obtain sufficient process margin for defining tunneling. For these (and other) reasons, various nonvolatile memory devices such as SONOS, FeRAM, SET and NROM have been studied actively as a substitute for the floating gate type cell. Among them, the SONOS cell has attracted great attention as a substitute nonvolatile memory device for the floating gate type cell.

In the meantime, the EEPROM type nonvolatile memory device may have an ETOX cell or a split gate type cell. The ETOX cell is formed in a simple stack structure. In case of the split gate type cell, two transistors are formed in each cell. Specifically, the ETOX cell has the stack structure of a floating gate and a control gate, wherein the floating gate stores charges therein, and the control gate receives a power. Meanwhile, in case of the split gate type cell, one memory cell includes the two transistors; that is, a selection transistor for selecting the cell, and a memory transistor for storing data. The memory transistor includes a floating gate, a control gate electrode, and a gate interlayer dielectric, wherein the floating gate stores charges therein, the control gate electrode controls the memory transistor, and the gate interlayer dielectric is interposed between the floating gate and the control gate electrode.

Hereinafter, a related art split gate type SONOS structure nonvolatile memory device will be described as follows.

Figure 1:
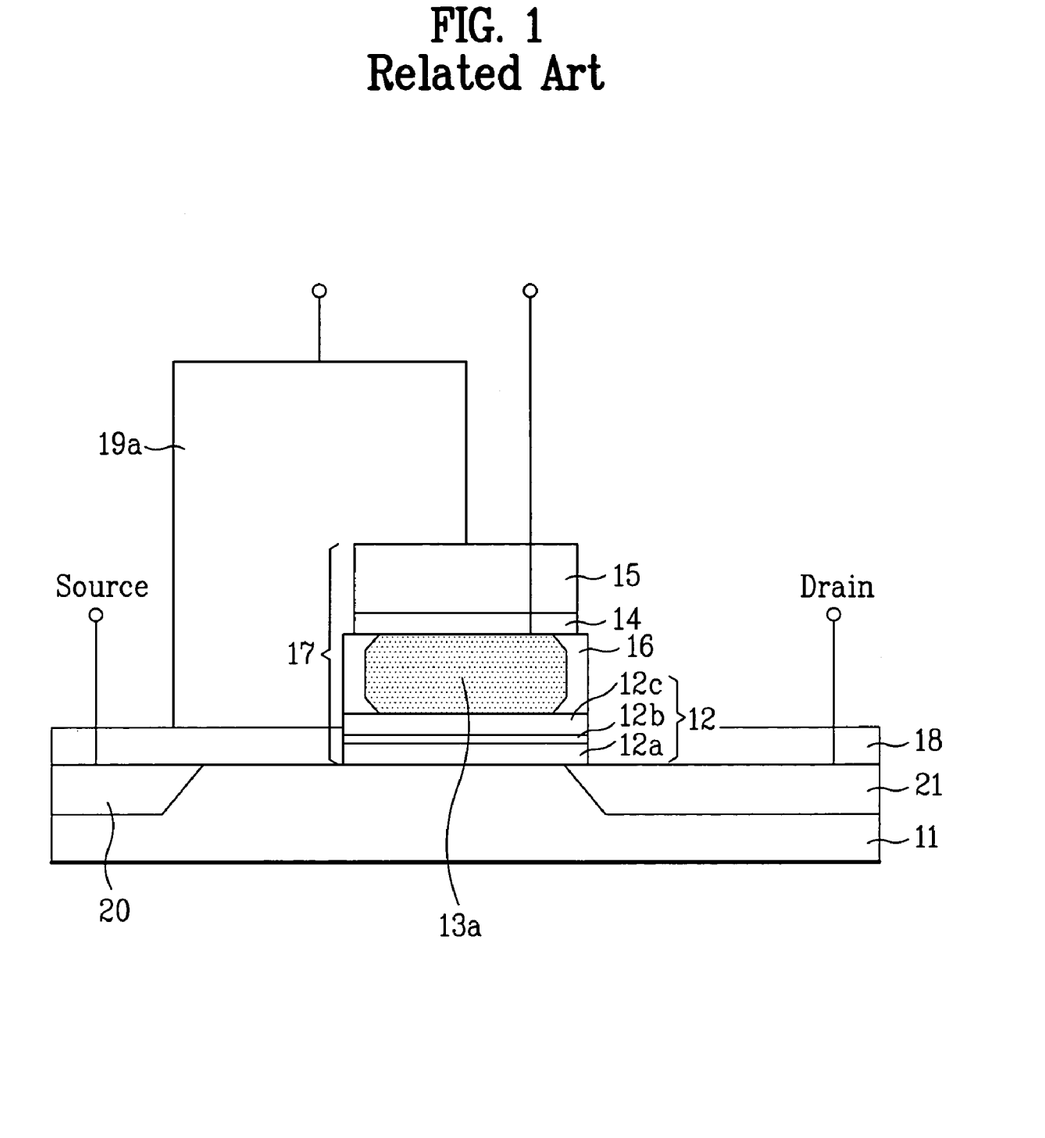
FIG. 1 is a cross sectional view of a split gate type SONOS nonvolatile memory cell according to the related art.

FIG. 1 is a cross sectional view of a split gate type SONOS structure nonvolatile memory device according to the related art. FIG. 2A to FIG. 2F are cross sectional views of the process for fabricating a split gate type SONOS structure nonvolatile memory device according to the related art.

As shown in FIG. 1, a gate stack 17 is formed on a predetermined portion of a semiconductor substrate 11, wherein the gate stack 17 has a structure of a sequentially stacked ONO layer (tunnel oxide 12a-trap nitride 12b-block oxide 12c) 12, control gate 13a, CVD (chemical vapor deposition layer 18 is formed at both sides of the stack gate 17 on the surface of the semiconductor substrate 11.

Also, a selection gate 19a partially overlaps with the gate stack 17. An oxide layer 16 is formed at both sides of the control gate 13a, whereby the selection gate 19a is insulated from the control gate 13a.

At this time, one side of the selection gate 19a overlaps with the gate stack 17, and the other side of the selection gate 19a overlaps with the semiconductor substrate 11. Also, the selection gate 19a is insulated from the semiconductor substrate 11 by the gate oxide layer 18.

Then, source and drain regions 20 and 21 are formed at both sides of the selection gate 19a and the gate stack 17 in the semiconductor substrate 11. Also, the selection gate 19a, the control gate 13a, the source region 20 and the drain region 21 are connected with respective lines for applying a bias voltage for programming, erasing and reading operations.

A method for fabricating the split gate type SONOS cell according to the related art will be described as follows.

Figure 2A:
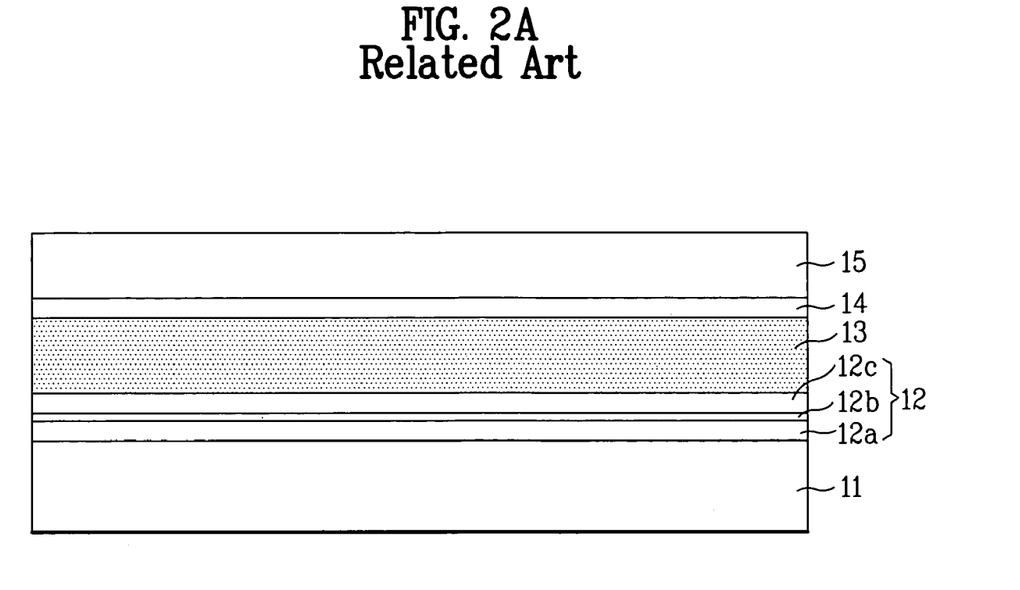

First, as shown in FIG. 2A, the tunnel oxide layer 12a, the trap nitride layer 12b and the block oxide layer 12c are sequentially stacked on the semiconductor substrate 11, thereby forming the ONO layer 12. Then, a first polysilicon layer 13, the CVD oxide layer 14 and the nitride layer 15 are sequentially formed on the ONO layer 12.

Figure 2B:
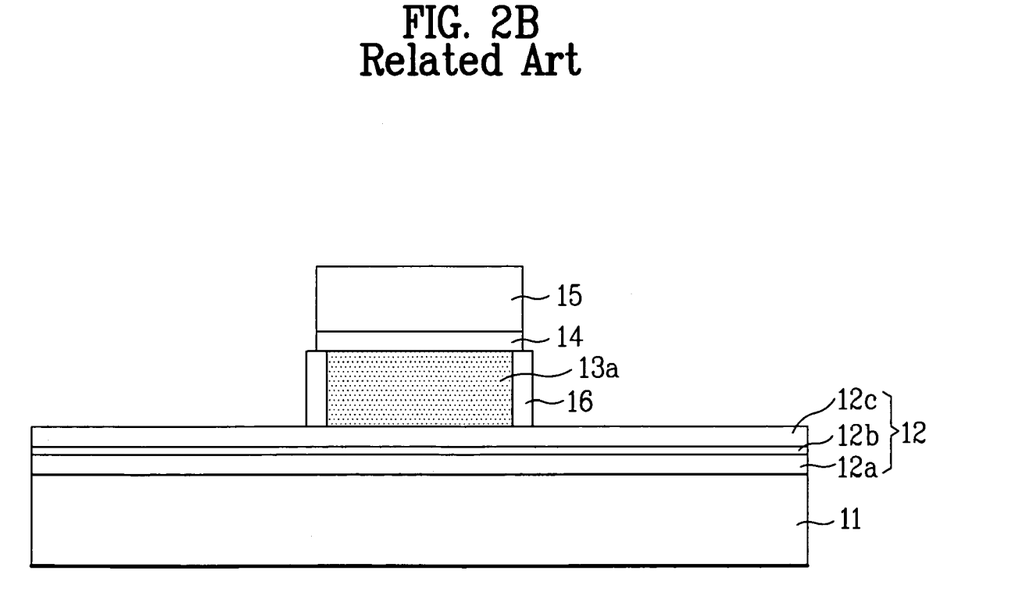

As shown in FIG. 2B, the first polysilicon layer 13, the CVD oxide layer 14 and the nitride layer 15 are selectively etched to remain on the predetermined portion of the semiconductor substrate 11. At this time, the etched first polysilicon layer 13 serves as the control gate 13a. By oxidizing the exposed portion of the control gate 13a, the oxide layer 16 is formed at the sides of the control gate 13a.

Figure 2C:
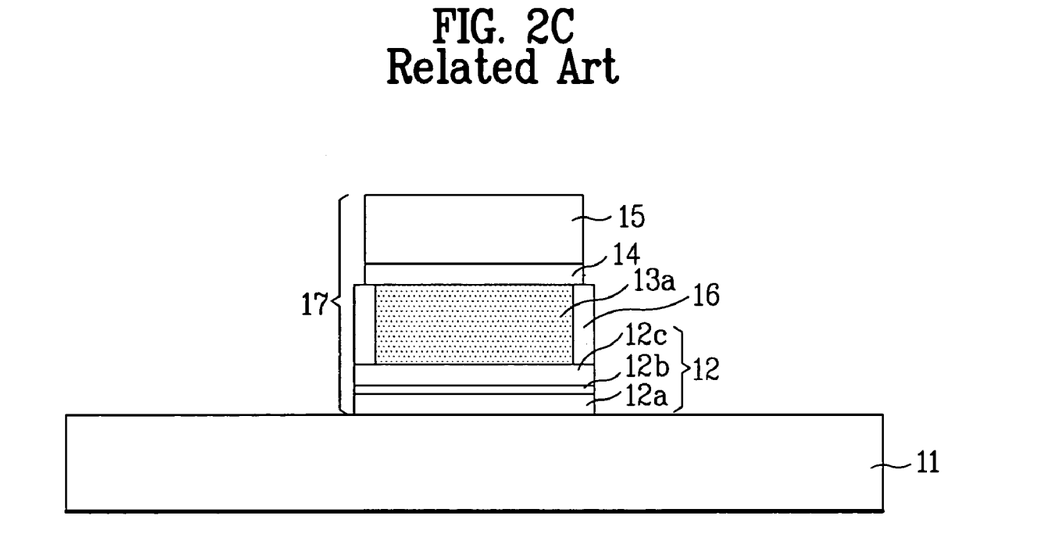

As shown in FIG. 2C, the ONO layer 12 is removed using the etched nitride layer 15 as a mask. Accordingly, it is possible to form the gate stack 17 including the ONO layer 12, the control gate 13a, the CVD oxide layer 14 and the nitride layer 15.

Figure 2D:
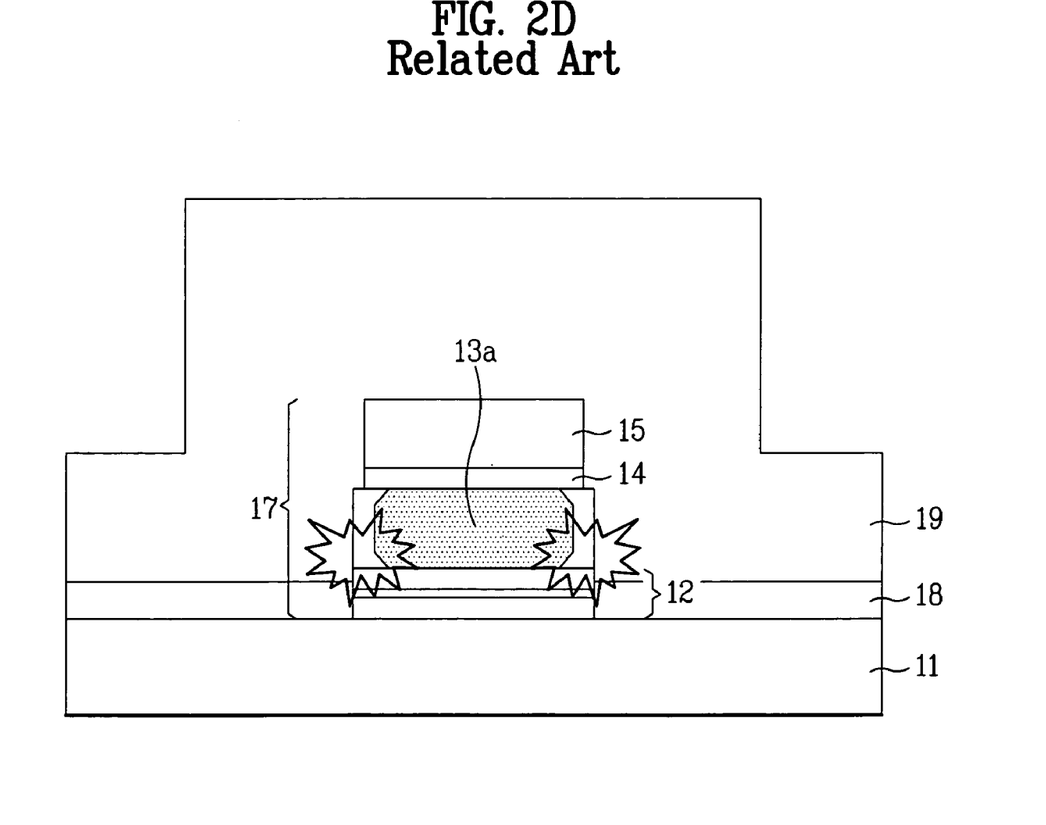

Referring to FIG. 2D, the gate oxide layer 18 is formed at both sides of the stack gate 18 in the surface of the semiconductor substrate 11 by oxidizing the surface of the exposed semiconductor substrate 11. Then, a second polysilicon layer 19 is formed on the entire surface of the semiconductor substrate 11 including the gate stack 17.

At this time, when forming the gate oxide layer 18, as shown in the drawings, the edge of the control gate 13a of the polysilicon material may be oxidized, thereby generating a "smiling" phenomenon in the ONO layer 12.

Figure 2E:
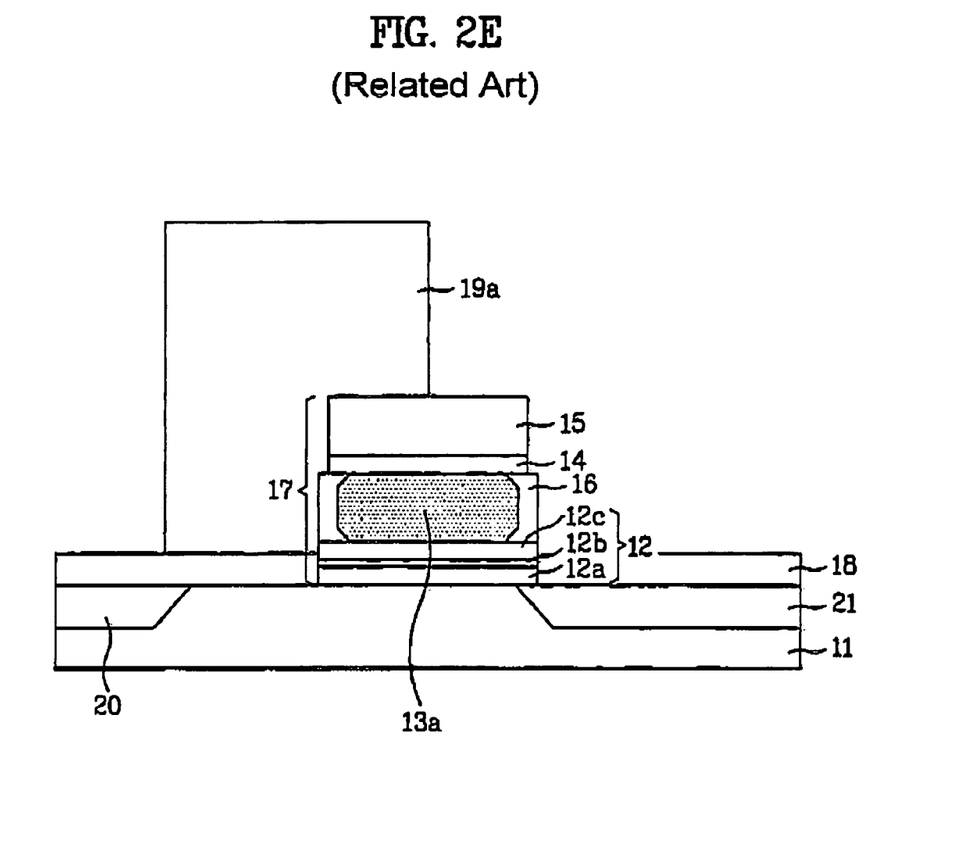

As shown in FIG. 2E, the second polysilicon layer 19 is selectively etched to remain on the predetermined portion of the gate stack 17 and the semiconductor substrate 11, thereby forming the selection gate 19a. Then, impurity ions are implanted into the semiconductor substrate 11 using the selection gate 19a and the gate stack 17 as a mask, thereby forming the source region 20 and the drain region 21. At this time, the source region 20 is formed at one side of the selection gate 19a in the semiconductor substrate 11, and the drain region 21 is formed at the opposite side of the gate stack 17 in the semiconductor substrate 11.

Figure 2F:
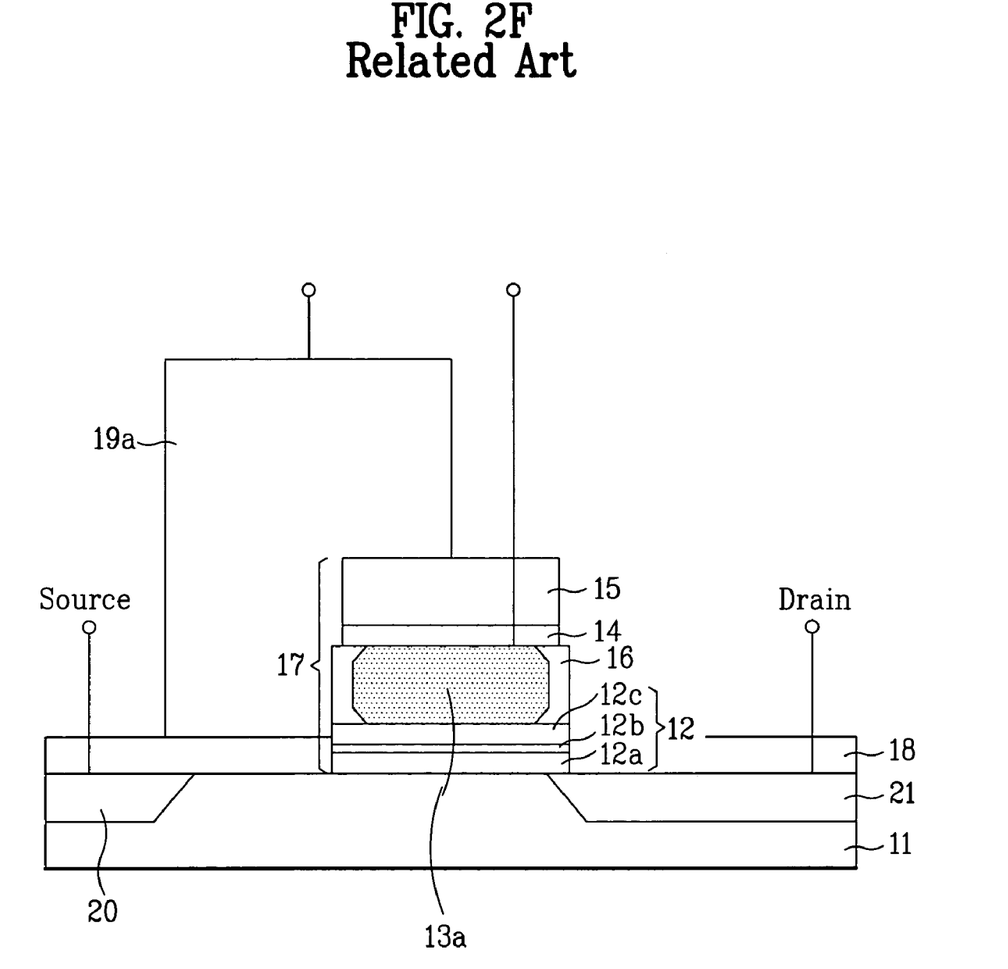

After that, as shown in FIG. 2F, conductive lines are respectively formed to the selection gate 19a, the control gate 13a, and the source and drain regions 20 and 21. Accordingly, it is possible to complete the split gate type SONOS cell.

However, the split gate type SONOS nonvolatile memory device according to the related art has the following disadvantages.

In the split gate type SONOS nonvolatile memory device according to the related art, when oxidizing the semiconductor substrate to form the gate oxide layer 18, the corner (s) of the control gate 13a may be oxidized, thereby generating the "smiling" phenomenon in the ONO layer. Also, the hot carriers generated during programming may tunnel or permeate into the portion of the ONO layer having the smiling phenomenon. In this case, it is difficult to perform the erasing operation. That is, when applying an erasing voltage, an electric field may not completely remove all charge carriers from the ONO layer, so that it becomes difficult to improve efficiency in the erasing operation.

SUMMARY OF THE INVENTION

Accordingly, the present invention is directed to a nonvolatile memory device and a method for fabricating the same that substantially obviates one or more problems due to limitations and disadvantages of the related art.

An object of the present invention is to provide a nonvolatile memory device and a method for fabricating the same, configured or adapted to prevent a smiling phenomenon in an ONO layer, thereby improving the programming and erasing characteristics, reliability and yield.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a nonvolatile memory device generally includes a semiconductor substrate; a gate insulating layer, a selection gate and a first insulating layer in sequence on the semiconductor substrate; an ONO layer on an entire surface of the semiconductor substrate including the selection gate; and a control gate on the ONO layer partially overlapping with the selection gate.

In another aspect, a method for fabricating a nonvolatile memory device generally includes the steps of sequentially stacking a gate insulating layer, a first conductive (e.g., polysilicon) layer and a first insulating layer on a semiconductor substrate; selectively patterning the first insulating layer, the first conductive layer and the gate insulating layer to form a selection gate; forming an ONO layer on an entire surface of the semiconductor substrate including the selection gate; and forming a control gate on the ONO layer at least partially overlapping with the selection gate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 2A to FIG. 2F are cross sectional views of the process for fabricating a split gate type SONOS nonvolatile memory cell according to the related art;

FIG. 4A to FIG. 4E are cross sectional views of the process for fabricating a split gate type SONOS nonvolatile memory cell according to the present invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a nonvolatile memory device and a method for fabricating the same according to the present invention will be described with reference to the accompanying drawings.

Figure 3:
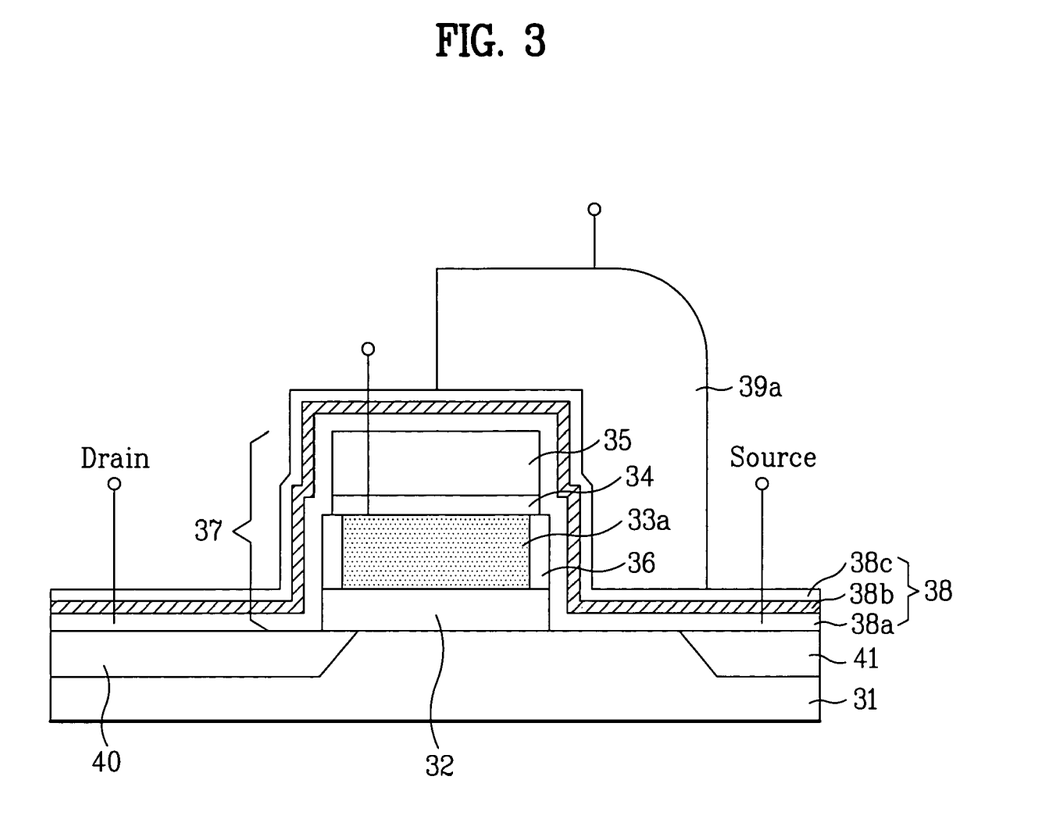
FIG. 3 is a cross sectional view of a split gate type SONOS nonvolatile memory cell according to the present invention.

FIG. 3 is a cross sectional view of a split gate type SONOS nonvolatile memory cell according to the present invention. FIG. 4A to FIG. 4E are cross sectional views of the process for fabricating a split gate type SONOS nonvolatile memory cell according to the present invention.

As shown in FIG. 3, a nonvolatile memory device according to the present invention includes a semiconductor substrate 31, a gate stack 37, and an ONO layer 38. The gate stack 37 is on a predetermined portion of the semiconductor substrate 31, and the gate stack 37 comprises, generally in sequence, a gate oxide layer 32, a selection gate 33a, a CVD oxide layer 34 and a nitride layer 35. Then, the ONO layer 38 is formed on an entire surface of the semiconductor substrate 31 including the gate stack 37. The ONO layer 38 comprises a tunnel oxide layer 38a, a trap nitride layer 38b and a blocking oxide layer 38c. In addition, a control gate 39a may be formed on the ONO layer 38, wherein the control gate 39a at least partially overlaps with the gate stack 37. Also, an oxide layer 36 is formed at both sides of the selection gate 33a, whereby the control gate 39a is insulated from the selection gate 33a.

At this time, the trap nitride layer of the ONO layer 38 functions to store electric charges (or provides a means for storing such electric charges), and the control gate 39a maintains a voltage in or an electric field across the trap nitride layer (e.g., it provides a means for maintaining a voltage in the trap nitride layer). Also, one side of the control gate 39a overlaps with a predetermined portion of the gate stack 37, and the other side of the control gate 39a overlaps with the semiconductor substrate 31. Then, source and drain regions 40 and 41 are formed at sides of the control gate 39a and the gate stack 37 in the surface of the semiconductor substrate 31.

Then, the control gate 39a, the selection gate 33a, the source region 40 and the drain region 41 are connected with respective conductor lines adapted to apply operating voltages for programming, erasing and reading operations.

A method for fabricating the split gate type SONOS structure nonvolatile memory cell according to the present invention will be described as follows.

Figure 4A:
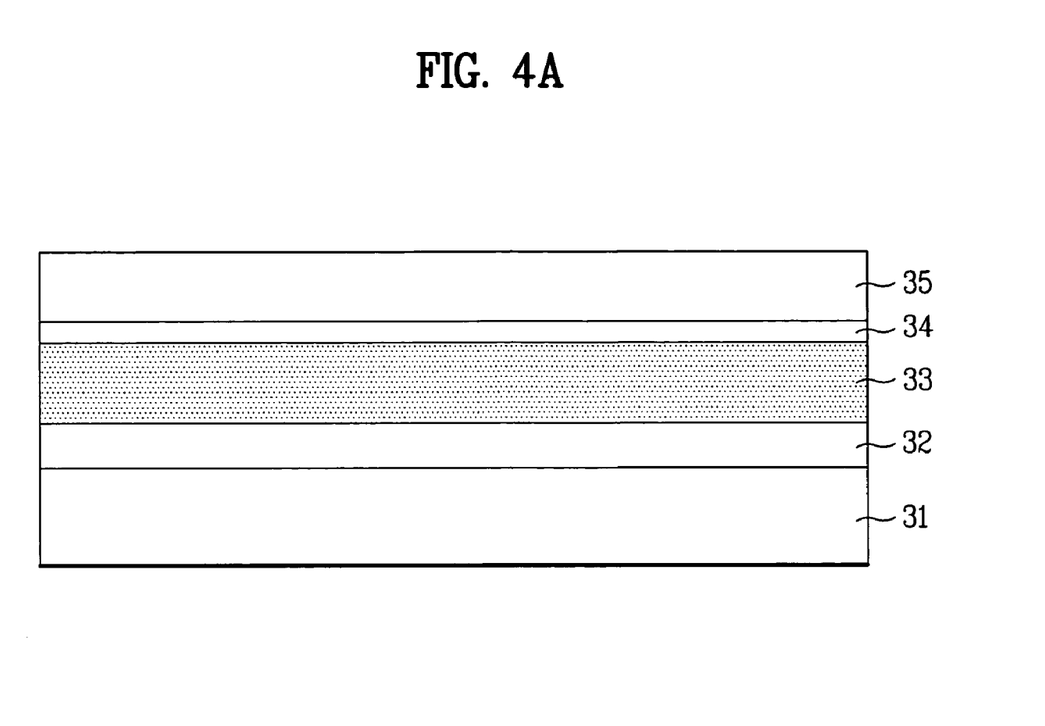

As shown in FIG. 4A, the gate oxide layer 32, a first conductive (e.g., polysilicon) layer 33, the oxide (e.g., a CVD oxide) layer 34 and the nitride layer 35 are sequentially formed on the semiconductor substrate 31.

Figure 4B:
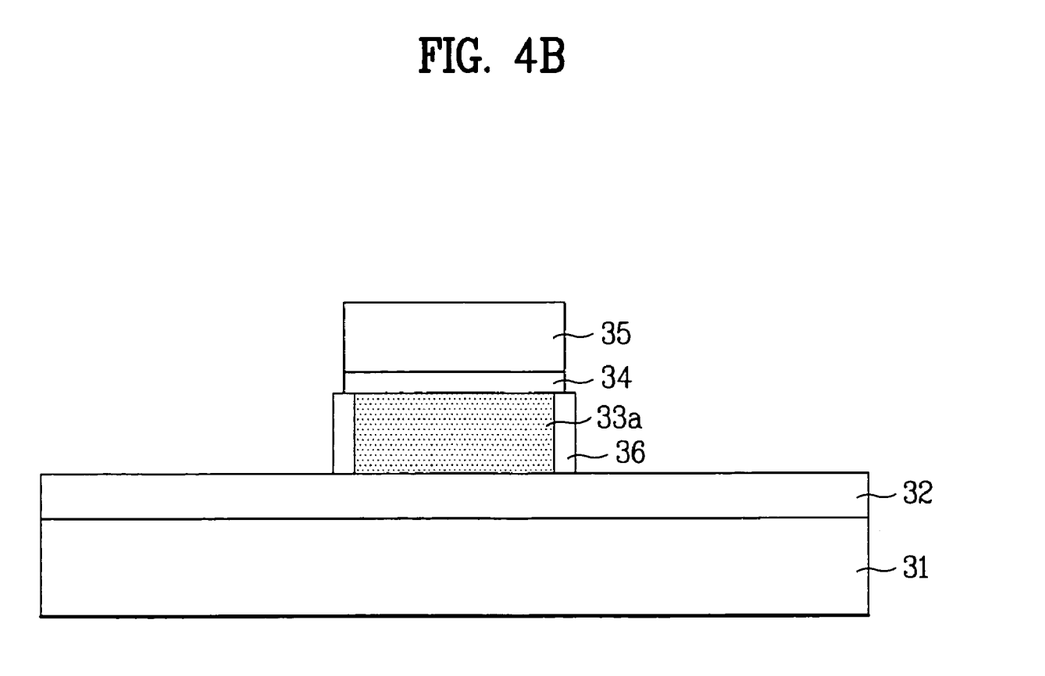

Referring to FIG. 4B, the nitride layer 35, the CVD oxide layer 34 and the first conductive layer 33 are selectively etched to leave a selection gate 33a remaining on the predetermined portion of the semiconductor substrate 31. Then, by oxidizing the exposed portion or surface(s) of the selection gate 33a, an oxide layer 36 is formed at the side of the selection gate 33a.

Figure 4C:
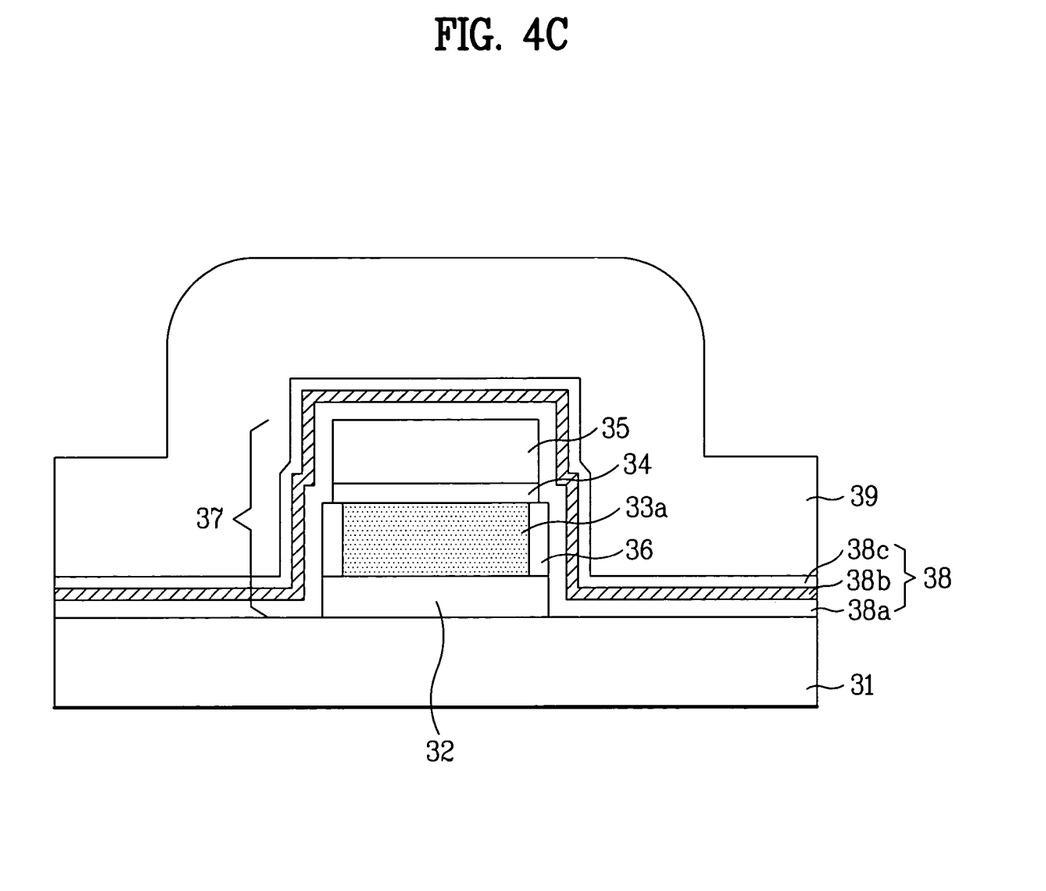

As shown in FIG. 4C, the gate oxide layer 32 is selectively removed, using the etched nitride layer 35 (and/or the selection gate 33a and oxide layer 36) as a mask. Accordingly, it is possible to form the gate stack 37 by sequentially stacking the gate oxide layer 32, the selection gate 33a, the CVD oxide layer 34 and the nitride layer 35.

Then, the tunnel oxide layer 38a, the trap nitride layer 38b and the blocking oxide layer 38c are sequentially formed on the semiconductor substrate 31 including the gate stack 37, thereby forming the ONO layer 38. Then, a second conductive (e.g., polysilicon-containing) layer 39 is formed on the ONO layer 38.

Figure 4D:
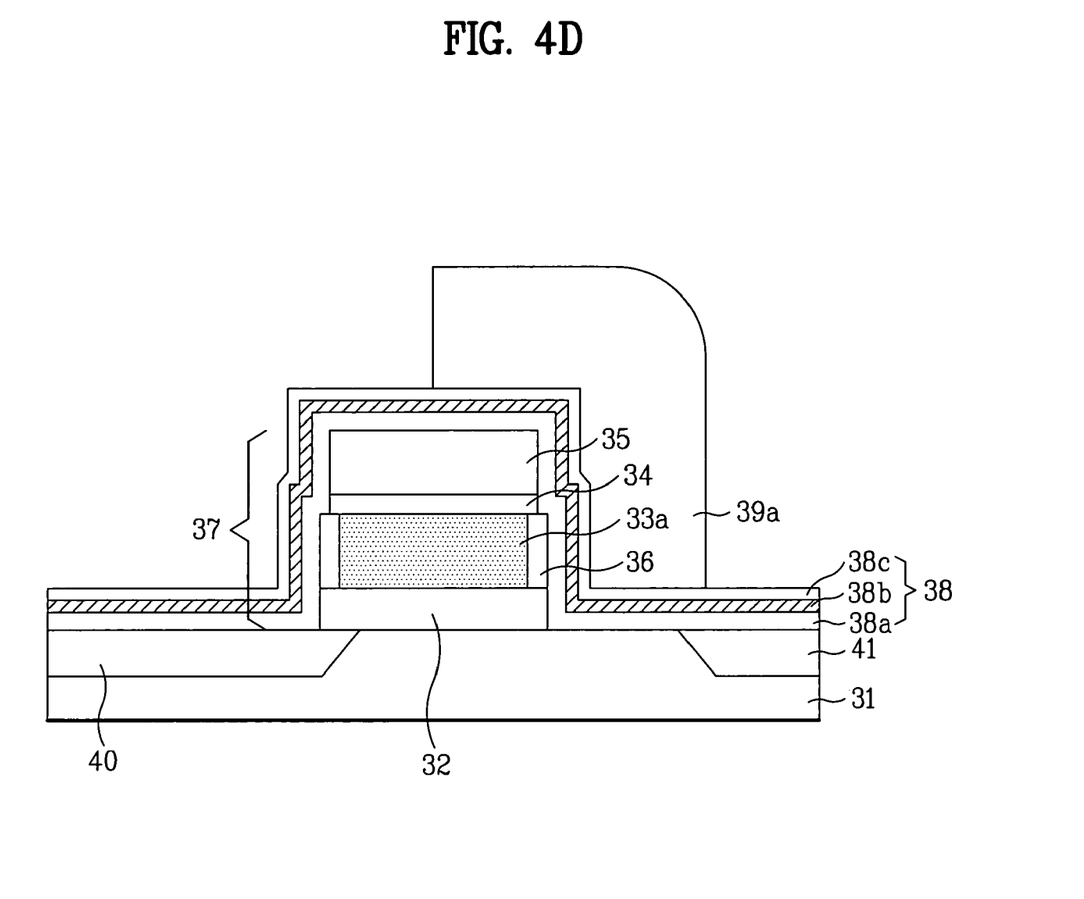

As shown in FIG. 4D, the second conductive layer 39 is selectively removed to remain on a predetermined portion of the gate stack 37 and the semiconductor substrate 31 adjacent to the gate stack 37, thereby forming the control gate 39a. Either or both of the first and second conductive layers may comprise a metal (e.g., aluminum), metal alloy (aluminum containing 0.5–4.0 wt. % of copper), conductive metal compound (e.g., titanium nitride) or polysilicon layer (which may be [heavily] doped and/or which may further comprise a metal silicide layer thereon).

Then, impurity ions are implanted to the semiconductor substrate 31 using the control gate 39a and the gate stack 37 as a mask, thereby forming the source and drain regions 40 and 41. Also, either before or after ion implantation to form the source and drain regions 40 and 41, the ONO layer 38 may be selectively etched using the control gate 39a as a mask.

Figure 4E:
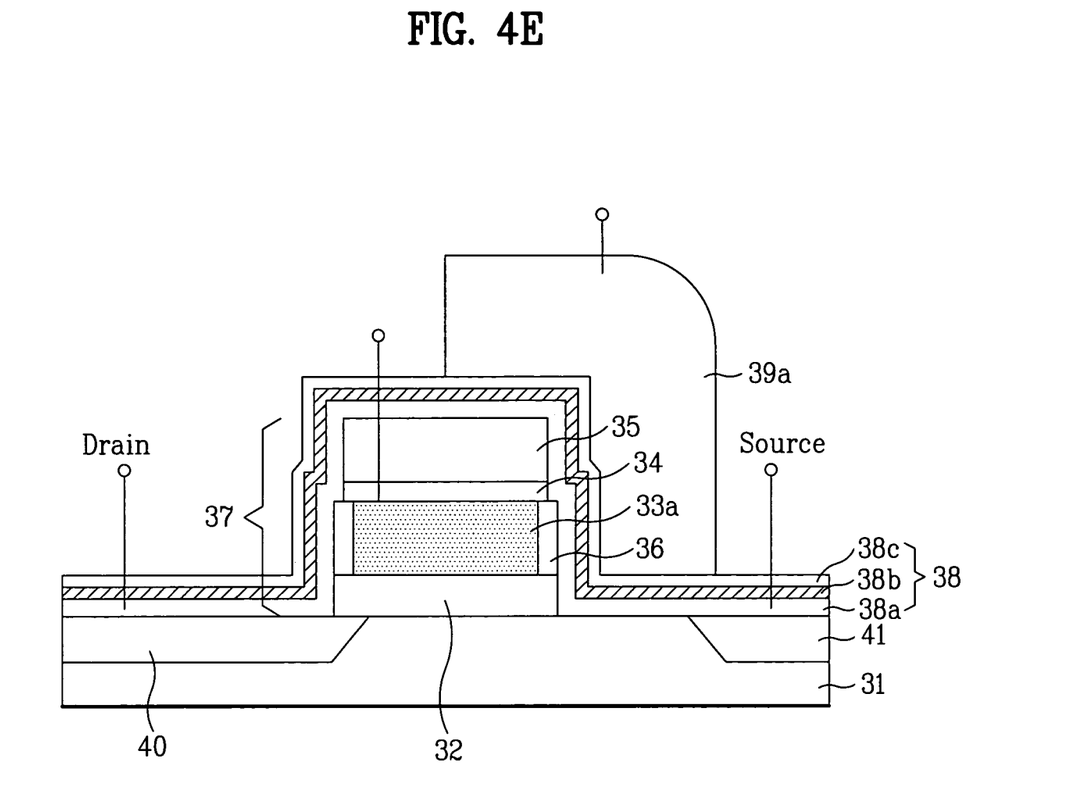

After that, as shown in FIG. 4E, respective conductor lines are formed to the control gate 39a, the selection gate 33a, and the source and drain regions 40 and 41. The conductor lines may comprise a metal (e.g., aluminum, titanium, tungsten, etc.), metal alloy (aluminum containing 0.5–4.0 wt. % of copper), and/or conductive metal compound (e.g., titanium silicide, titanium nitride, cobalt silicide, molybdenum silicide, tungsten nitride, etc.). As an alternative to selective etching as described above, conventional contact or via openings through the ONO layer 38 may be formed prior to formation of conductor lines to the control gate 39a, the selection gate 33a, and the source and drain regions 40 and 41.

Accordingly, it is possible to complete the split gate type SONOS structure nonvolatile memory cell according to the present invention.

As mentioned above, the nonvolatile memory device and the method for fabricating the same according to the present invention has the following advantages.

First, the ONO layer is formed on the gate stack, so that the "smiling phenomenon" in the ONO layer may be reduced, minimized or prevented. Accordingly, it is possible to prevent hot carriers generated during programming from entering into the portion of the ONO layer having the smiling phenomenon, thereby enabling efficient erasing operations. As a result, it is possible to improve uniformity, reliability and yield.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a nonvolatile memory device comprising:

sequentially stacking a gate insulating layer, a first conductive layer and a first insulating layer on a semiconductor substrate;

patterning the first insulating layer, the first conductive layer and the gate insulating layer to form a selection gate;

forming a second insulating layer at sides of the selection gate by oxidizing an exposed surface of the selection gate;

forming an ONO layer on the semiconductor substrate including the selection gate;

forming a control gate on the ONO layer, partially overlapping with the selection gate and partially overlapping with a channel region of the semiconductor substrate; and forming source and drain regions by implanting impurity ions in to the semiconductor substrate using the selection gate and control gate as a mask.

2. The method of claim 1, further comprising forming respective lines connected with the selection gate, the control gate and the source and drain regions.

3. The method of claim 1, wherein the step of forming the selection gate includes:

selectively etching the first insulating layer and the first conductive layer;

oxidizing the sides of the etched first conductive layer; and selectively removing the gate insulating layer using the first insulating layer as a mask.

4. The method of claim 1, further comprising forming conductor lines to the control gate, the selection gate, and the source and drain regions.

5. The method of claim 1, wherein the first conductive layer comprises polysilicon.

6. The method of claim 1, wherein the first insulating layer comprises an oxide layer.

7. The method of claim 6, wherein the first insulating layer further comprises a nitride layer.

8. The method of claim 1, wherein the first insulating layer comprises a nitride layer.

9. The method of claim 1, wherein the ONO layer comprises comprising a tunnel oxide layer, a trap nitride layer, and a blocking oxide layer.

10. The method of claim 9, wherein forming the ONO layer comprises sequentially forming the tunnel oxide layer, the trap nitride layer, and the blocking layer on the semiconductor substrate and the selection gate, including sidewalls of the selection gate.

11. The method of claim 1, wherein the control gate comprises a polysilicon-containing layer, a metal, a metal alloy, or a conductive metal compound.

12. The method of claim 1, wherein forming the control gate comprises depositing a second conductive layer, then selectively removing portions of the second conductive layer.

13. The method of claim 12, wherein the control gate and the ONO layer overlap a portion of the selection gate and a portion of the substrate between the source and drain.

14. The method of claim 1, further comprising selectively etching the ONO layer using the control gate as a mask.

15. The method of claim 11, wherein the control gate comprises doped polysilicon.

* * * * *